United States Patent
Li et al.

(10) Patent No.: US 9,647,042 B2
(45) Date of Patent: May 9, 2017

(54) ORGANIC LIGHT-EMITTING DIODE DISPLAY PANEL HAVING INDUCTION LINES ON A PIXEL DEFINING LAYER

(71) Applicant: EverDisplay Optronics (Shanghai) Limited, Shanghai (CN)

(72) Inventors: Zheng Li, Shanghai (CN); Chungche Tsou, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 15/004,106

(22) Filed: Jan. 22, 2016

(65) Prior Publication Data
US 2016/0218158 A1    Jul. 28, 2016

(30) Foreign Application Priority Data
Jan. 26, 2015  (CN) .......................... 2015 1 0039558

(51) Int. Cl.

| | | |
|---|---|---|
| *H01L 27/15* | (2006.01) | |
| *H01L 31/12* | (2006.01) | |
| *H01L 33/00* | (2010.01) | |
| *H01L 27/32* | (2006.01) | |
| *H01L 51/52* | (2006.01) | |

(52) U.S. Cl.
CPC .......... *H01L 27/323* (2013.01); *H01L 51/524* (2013.01)

(58) Field of Classification Search
CPC . H01L 27/32; H01L 27/3202; H01L 27/3204; H01L 27/3209; H01L 27/3225; H01L 27/3251; H01L 27/3258; H01L 2227/32; H01L 2924/12044
See application file for complete search history.

(56) References Cited

U.S. PATENT DOCUMENTS

2012/0105337 A1    5/2012  Jun et al.
2016/0293676 A1*  10/2016  Komatsu .................. G02B 5/20

FOREIGN PATENT DOCUMENTS

| CN | 103823601 A | 5/2014 |
|---|---|---|
| CN | 103887324 A | 6/2014 |
| CN | 104216596 A | 12/2014 |
| KR | 20140137740 A | 12/2014 |

OTHER PUBLICATIONS

The First OA issued on Dec. 22, 2016 by the CN Office.

* cited by examiner

*Primary Examiner* — Hoai V Pham
(74) *Attorney, Agent, or Firm* — Yunling Ren

(57) ABSTRACT

Disclosed is an organic light-emitting diode display panel, including: a substrate; a thin-film transistor layer including a plurality of thin-film transistors, arranged on the substrate; a plurality of organic light-emitting diode subpixel structures, arranged on the thin-film transistor layer; a pixel defining layer including a plurality of openings, arranged on the thin-film transistor layer; a plurality of first direction induction lines and second direction induction lines, arranged on the pixel defining layer; an insulation layer, arranged between the plurality of first direction induction lines and second direction induction lines; and a packaging substrate, arranged on the plurality of second direction induction lines. The organic light-emitting diode display panel employs a touch control electrode having a metal mesh structure, the touch control electrode is directly deposited on the pixel defining layer, and the touch control function is directly integrated on the organic light-emitting diode display panel.

16 Claims, 3 Drawing Sheets

ORGANIC LIGHT-EMITTING DIODE DISPLAY PANEL HAVING INDUCTION LINES ON A PIXEL DEFINING LAYER

This application is based upon and claims priority to Chinese Patent Application No. 201510039558.5, filed on Jan. 26, 2015, the entire contents of which are incorporated herein by reference.

TECHNICAL FIELD

The present disclosure relates to the field of organic light-emitting diode display technologies, and more particularly, relates to an organic light-emitting diode display panel.

BACKGROUND

The display integrated touch control technology which controls displays by means of induction has been widely applied to such display devices as mobile phones, tablet computers or the like. Organic light-emitting diodes (OLEDs) have been recognized as a new generation of displays replacing liquid crystal displays (LCDs) with such advantages as active light emission, high contrast, quick response, and light and thin. Organic light-emitting diode displays having an integration function are the mainstream touch control displays.

In the related art, in the organic light-emitting diode displays having the integrated touch control function, touch screens are typically arranged on packaging glass of the organic light-emitting diode display apparatuses.

SUMMARY

The present disclosure provides an organic light-emitting diode display panel, including: a substrate, having a plurality of thin-film transistor units thereon; a plurality of organic light-emitting diode subpixel structures, arranged on the plurality of thin-film transistor units; a pixel defining layer, arranged on the substrate, the pixel defining layer including a plurality of openings to receive the plurality of subpixel structures; a plurality of first direction induction lines and a plurality of second direction induction lines, arranged on the pixel defining layer; an insulation layer, arranged between the plurality of first direction induction lines and the plurality of second direction induction lines to cover the plurality of first direction induction lines and the plurality of organic light-emitting diode subpixel structures; and a packaging substrate, arranged on the plurality of second direction induction line.

The organic light-emitting diode display panel according to the present disclosure employs a touch control electrode having a metal mesh structure, the touch control electrode is directly deposited on the pixel defining layer, and the touch control function is directly integrated on the organic light-emitting diode display panel.

DETAILED DESCRIPTION

The technical solution of the present disclosure is described in detail with reference to the specific embodiments. The protection scope of the present disclosure is not limited to the following embodiments, and the embodiments listed hereinafter are merely for illustrative purpose but are not intended to limit the present disclosure in any way.

Figure 1:
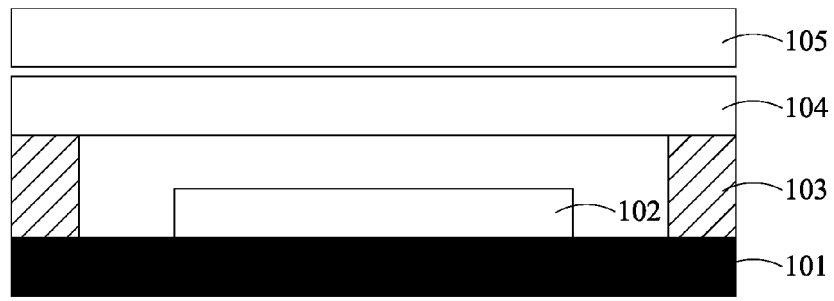
FIG. 1 is a schematic structural view of an organic light-emitting diode display panel in the related art.

FIG. 1 is a schematic structural view of an organic light-emitting diode display panel in the related art. As illustrated in FIG. 1, an organic light-emitting diode device 102 is arranged between a TFT backplane 101 and a packaging glass 104, and is sealed via a packaging adhesive 103. A touch screen 105 is formed on the packaging glass 104, for example, the touch screen is formed by means of lamination. The touch screen 105 may be a capacitive touch control screen or a resistive touch control screen. The anodes of the touch screen 105 and the organic light-emitting diode device 102 associate the touch control position with the displayed content via a peripheral circuit, which implements touch control of the displayed content under processing by the operating system.

In the above organic light-emitting diode display panel, the touch screen 105 is itself a multilayer structure and has multiple layers of glass interfaces, and at least one layer of glass interface is further present between the organic light-emitting diode device 102 and the touch screen 105. This increases the reflection of the light emitted by the organic light-emitting diode, and reduces the extraction of the emitted light. A improving of the light emission luminance by increasing the current of the organic light-emitting diode is required, and thus the service life of the organic light-emitting diode device is shortened. In addition, the glass interface also increases the reflection of the external light, and reduces outdoor readability. Further, to reduce the reflection of the external light, in addition to the use of the circular polarizer sheet, an anti-reflection film is added on the outermost layer of glass, thereby increasing the manufacture cost.

Figure 2:
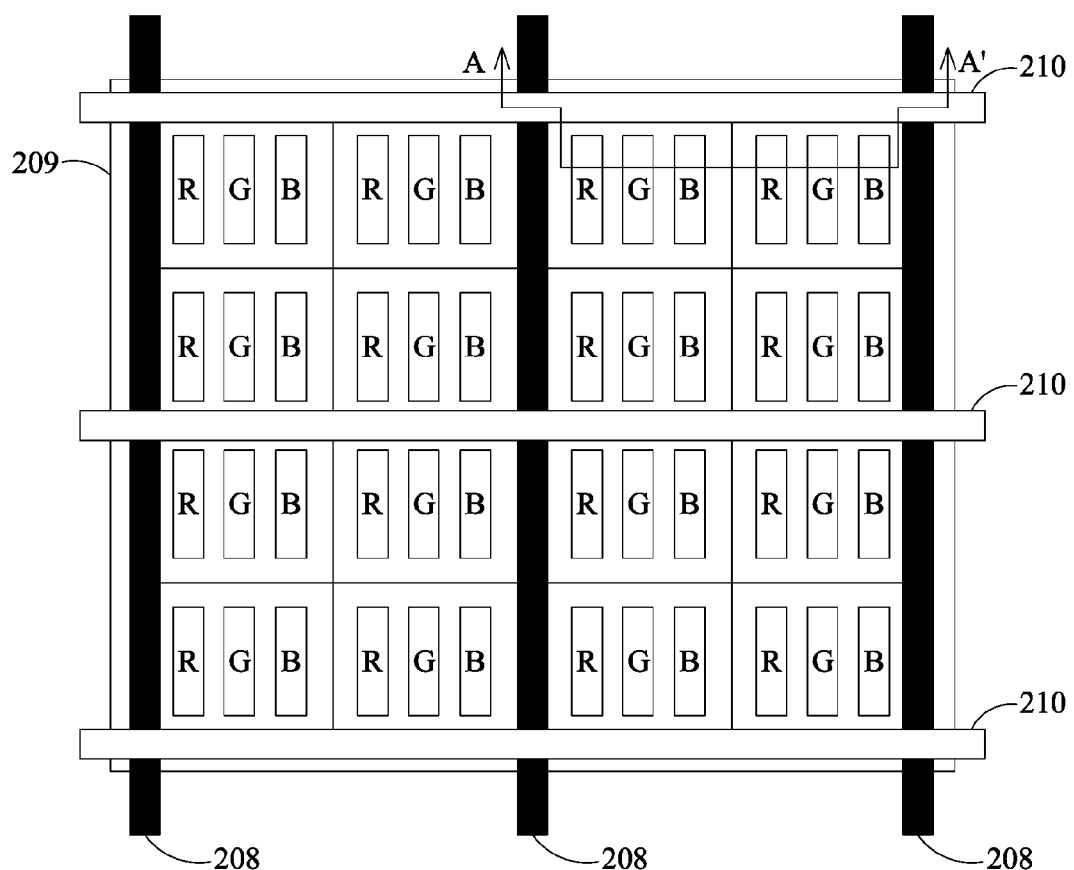
FIG. 2 is a plan view of an organic light-emitting diode display panel according to an embodiment of the present disclosure.
Figure 3:
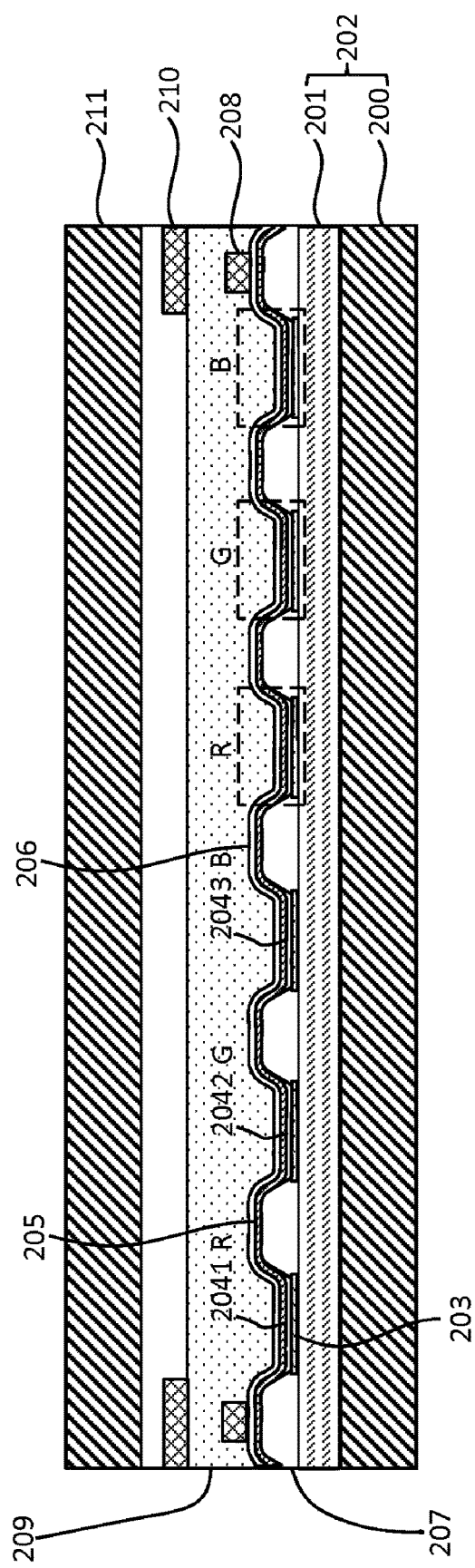
FIG. 3 is a sectional view taken along an A-A' line of FIG. 2.

FIG. 2 is a plan view of an organic light-emitting diode display panel according to an embodiment of the present disclosure; and FIG. 3 is a sectional view taken along an A-A' line of FIG. 2. As illustrated in FIG. 2 and FIG. 3, an organic light-emitting diode display panel according to the present disclosure includes a substrate 200, a thin-film transistor layer 201, a plurality of subpixel structures, a pixel defining layer 207 configured to receive the plurality of subpixel structures, a plurality of first direction induction lines 208, a plurality of second direction induction lines 210, an insulation layer 209, and a packaging substrate 211.

The substrate 200 and the thin-film transistor layer 201 collaboratively form a thin-film transistor array substrate 202.

The substrate 200 may be made of such transparent insulating materials as glass, plastics, or ceramics.

The thin-film transistor layer 201 is arranged on the substrate 200, and includes a plurality of thin-film transistors, wherein each of the thin-film transistors may be a polycrystalline silicon (including a low temperature polycrystalline silicon and a high temperature polycrystalline silicon) thin-film transistor, or an oxide thin-film transistor, or an amorphous silicon thin-film transistor, or an organic thin-film transistor, or the like, the specific structure thereof is not illustrated in the drawings.

Each of the subpixel structures includes an organic light-emitting diode device, and the organic light-emitting diode device is actively driven by the thin-film transistor layer, thereby forming an active matrix organic light-emitting diode (AMOLED) display apparatus. The organic light-emitting diode device may be a single color device (including red, green, blue, yellow or the like) or a multi-color device (including, double colors of red and green, double colors of blue and green, double colors of blue and red, full colors of red, green and blue, or the like). As illustrated in FIG. 2, the subpixel structure includes a red subpixel R, a green subpixel and a blue subpixel B.

The organic light-emitting diode device may be a cathode emission organic light-emitting diode device or an anode emission organic light-emitting diode device. As illustrated in FIG. 3, each organic light-emitting diode device includes a first electrode 203, a light-emitting function layer, a second electrode 205, and a capping layer 206.

When the organic light-emitting diode device may be a cathode emission organic light-emitting diode device, the first electrode 203 is a total reflection anode, for example, such a metal material as aluminum, silver, magnesium, palladium, platinum or the like, which may be singly or cooperatively used, and may be formed by means of sputtering or vapor deposition or the like.

The second electrode 205 is a transparent cathode, and is made of a transmission or semi-transmission material, for example, such a metal oxide material as indium tin oxide (ITO), indium zinc oxide (IZO), aluminum zinc oxide (AZO), or zinc oxide (ZnO), which may be singly used or cooperatively used, and may be formed by means of sputtering or vapor deposition or the like.

The light-emitting function layer 204 is a cathode emission light-emitting function layer, and in a direction pointing from the first electrode 203 to the second electrode 205, the light-emitting function layer 204 includes: a hole injection layer, a hole transmission layer, a light-emitting layer, an electron transmission layer, and an electron injection layer that are sequentially arranged.

The hole injection layer is required to match the anode and the neighboring hole transmission layer well in terms of energy level, and may be, but not limited to, CuPc, TNATA, and PEDOT. An exemplary implement is that the hole injection layer employs a p-type doping structure, wherein an oxidant such as $SbCl_5$, $FeCl_3$, iodine, F4-TCNQ or TBAHA may be doped into the hole transmission material. Nevertheless, a quantum well structure or any other structure capable of improving hole injection may be employed.

The hole transmission layer is required to have a high hole mobility ratio and a high thermal stability, and it is further required that the hole transmission layer is a non-pinhole thin film formed by means of vacuum vapor deposition. The hole transmission material may be selected from one of: pairedly coupled diamine compounds, for example, TPD, TAPC, NPB, β-NPB and α-NPD; triphenyl amine compounds, for example, TDAB, TDAPB, PTDATA and spiro-mTTB; or some triarylamine polymers and carbazole compounds.

The light-emitting layer may include an organic material or inorganic material, for example, a small molecule material, a polymer material or an organometallic complex, which may be formed by means of thermal vacuum vapor deposition, spin coating, ink jetting, laser transfer printing, screen printing, or the like.

The electron transmission layer is required to have a high electron mobility ratio, a high glass transition temperature and thermal stability, and it is further required that the electron transmission layer is a uniform and a non-microporous thin film formed by means of thermal vapor deposition. The electron transmission layer may be made of a material selected from oxazolederivatives, metal chelate quinoline derivatives, quinoxaline derivatives, phenazine derivatives, phenanthroline derivatives, and heterocyclic compounds containing silicon.

The electron injection layer may be made of a material selected from lithium oxide, boron lithium oxide, silicon potassium oxide, cesium carbonate, or alkali metal fluoride such as lithium fluoride, potassium fluoride, cesium fluoride.

The capping layer 206 is one layer in the organic light-emitting diode device structure, and is configured to enhance light emission. The capping layer 206 may be an organic material or an inorganic material, or may be a stacking of a plurality of layers, with a refractive index of about 1.8.

The pixel defining layer 207 is arranged on the thin-film transistor layer 201, and is made of, for example, silicon oxide, silicon nitride, organic non-conductive polymer or a combination thereof; and may be formed by means of such manufacture methods as physical vapor deposition, chemical vapor deposition, and spin coating. The pixel defining layer 207 includes a plurality of openings to receive the plurality of subpixel structures, wherein the plurality of subpixel structures are spaced apart from each other, such that a light-emitting region and a non-light-emitting region are defined. The organic light-emitting diode device is arranged in the light-emitting region.

The first direction inductive line 208 is arranged on the pixel defining layer 207, and serves as a first touch control electrode. The first direction induction lines 208 are parallel to each other. The first direction induction lines 208 are vapor deposited on the pixel defining layer 207. Further, the first direction induction lines 208 are arranged on the second electrode and the capping layer on the pixel defining layer 207.

The insulation layer 209 is a front-formed layer, which covers the first direction induction lines 208 and meanwhile covers the capping layer 206 of the organic light-emitting diode device. The insulation layer 209 is made of an insulating material, to prevent the first direction induction lines 208 and the second direction induction lines 210 from short circuit. In addition, the refractive index of the insulation layer 209 is less than that (about 1.8) of the capping layer 206, for example, from 1.5 to 1.8, to enhance light emission of the organic light-emitting diode device.

The second direction induction line 210 is arranged on the insulation layer 209, and serves as a second touch control electrode. The second direction induction lines 210 are parallel to each other, and may be formed by means of vapor deposition.

The plurality of first direction induction lines 208 are substantially perpendicular to the plurality of second direction induction lines 210, such that a metal mesh structure is formed.

A plurality of subpixel structures are arranged along a specific direction, thereby forming a plurality of pixel rows and a plurality of pixel columns (that is, a plurality of subpixels in the same row form a pixel row, and a plurality of subpixels in the same column form a pixel column). The first direction induction lines 208 partially overlap the plurality of pixel rows and the plurality of pixel columns, i.e., at the spacing positions of the plurality of subpixel structures, such that the impacts caused to the light emission of the organic light-emitting diode device are reduced; and the same arrangement is applied to the second direction induction lines 210.

A preferred embodiment is as illustrated in FIG. 2. The first direction induction lines 208 and the second direction induction lines 210 are all arranged on the pixel defining layer 207, i.e., over the non-light-emitting region, and may not cover the subpixel structures at all, such that no impact is caused to the light emission of the organic light-emitting diode device.

Since no impact is caused to the light emission, the first direction induction lines 208 and the second direction induction lines 210 are all made of a metal conductive material, for example, silver (Ag) or the like, without being limited to the transparent conductive material in the related art.

As illustrated in FIG. 2, the neighboring first direction induction lines 208 are spaced apart from each other by two subpixel structures, and the neighboring second direction induction lines 210 are also spaced apart from each other by two subpixel structures. Nevertheless, no limitation is set to the manner of spacing apart two induction lines, and the neighboring induction lines may be spaced apart from each other by one subpixel structure, three subpixel structures, or even more subpixel structures. The spacing, i.e., the density of the metal mesh, is mainly set in consideration of the sensor sensitivity of the touch screen.

The packaging substrate 211 is arranged over the second direction induction lines 210, and configured to provide light emission and protect the organic light-emitting diode and the touch control structure. The refractive index of the packaging substrate 211 is generally lower than the refractive index of the insulation layer 209, for example, about 1.5, to enhance the light emission.

In conclusion, the organic light-emitting diode display panel according to the present disclosure employs a touch control electrode having a metal mesh structure, the touch control electrode is directly deposited on the pixel defining layer, and the touch control function is directly integrated on the organic light-emitting diode display panel. This reduces the glass interfaces, increases extraction of the light emitted by the organic light-emitting diode display panel, improves the light emission efficiency, and reduces the reflection of the external light.

A person skilled in the art shall note that the embodiments described in the present disclosure are merely for illustration purpose, and other replacements, modifications, and improvements may be made within the scope of the present disclosure. Therefore, the present disclosure is not limited to the above embodiments, and is defined only by the appended claims.

REFERENCE SIGNS AND DENOTATIONS THEREOF

101: TFT backplane
102: Organic light-emitting diode device
103: Packaging adhesive
104: Packaging glass
105: Touch screen
200: Substrate
201: Thin-film transistor layer
202: Thin-film transistor array substrate
203: First electrode
2041R: Light-emitting function layer
2042G: Light-emitting function layer
2043B: Light-emitting function layer
205: Second electrode
206: Capping layer
207: Pixel defining layer
208: First direction induction lines
209: Insulation layer
210: Second direction induction lines
211: Packaging substrate
R, G, B: Subpixels

What is claimed is:

1. An organic light-emitting diode display panel, comprising:
    a substrate, having a plurality of thin-film transistor units thereon;
    a plurality of organic light-emitting diode subpixel structures, arranged on the plurality of thin-film transistor units;
    a pixel defining layer, arranged on the substrate, the pixel defining layer comprising a plurality of openings to receive the plurality of subpixel structures;
    a plurality of first direction induction lines and a plurality of second direction induction lines, arranged on the pixel defining layer;
    an insulation layer, arranged between the plurality of first direction induction lines and the plurality of second direction induction lines to cover the plurality of first direction induction lines and the plurality of organic light-emitting diode subpixel structures; and
    a packaging substrate, arranged on the plurality of second direction induction lines.

2. The organic light-emitting diode display panel according to claim 1, wherein each of the plurality of organic light-emitting diode subpixel structures comprises an organic light-emitting diode device, the organic light-emitting diode device comprising:
    a first electrode;
    a light-emitting function layer, arranged on the first electrode;
    a second electrode, arranged on the light-emitting function layer and the pixel defining layer; and
    a capping layer, arranged on the second electrode.

3. The organic light-emitting diode display panel according to claim 2, wherein the insulation layer is arranged on the capping layer.

4. The organic light-emitting diode display panel according to claim 3, wherein a refractive index of the insulation layer is less than that of the capping layer.

5. The organic light-emitting diode display panel according to claim 1, wherein the plurality of first direction induction lines are substantially perpendicular to the plurality of second direction induction lines.

6. The organic light-emitting diode display panel according to claim 5, wherein the plurality of organic light-emitting diode subpixel structures form a plurality of pixel rows and a plurality of pixel columns, and the plurality of first direction induction lines and the plurality of second direction induction lines respectively and partially overlap the plurality of pixel rows and the plurality of pixel columns.

7. The organic light-emitting diode display panel according to claim 6, wherein the plurality of first direction induction lines and the plurality of second direction induction lines are made of a metal conductive material.

8. The organic light-emitting diode display panel according to claim 5, wherein the plurality of first direction induction lines and the plurality of second direction induction lines partially cover the plurality of organic light-emitting diode subpixel structures.

9. The organic light-emitting diode display panel according to claim 8, wherein the plurality of first direction induction lines and the plurality of second direction induction lines are made of a metal conductive material.

10. The organic light-emitting diode display panel according to claim to 5, wherein any two adjacent of the plurality of first direction induction lines are spaced apart from each other by at least two of the plurality of organic light-emitting diode subpixel structures.

11. The organic light-emitting diode display panel according to claim 10, wherein the plurality of first direction induction lines and the plurality of second direction induction lines are made of a metal conductive material.

12. The organic light-emitting diode display panel according to claim 10, wherein the plurality of organic light-emitting diode subpixel structures comprise a red subpixel, a green subpixel, and a blue subpixel.

13. The organic light-emitting diode display panel according to claim to 5, wherein any two adjacent of the plurality second direction induction lines are spaced apart from each other by at least two of the plurality of organic light-emitting diode subpixel structures.

14. The organic light-emitting diode display panel according to claim 13, wherein the plurality of first direction induction lines and the plurality of second direction induction lines are made of a metal conductive material.

15. The organic light-emitting diode display panel according to claim 13, wherein the plurality of organic light-emitting diode subpixel structures comprise a red subpixel, a green subpixel, and a blue subpixel.

16. The organic light-emitting diode display panel according to claim 5, wherein the plurality of first direction induction lines and the plurality of second direction induction lines are made of a metal conductive material.

\* \* \* \* \*